(12) United States Patent
Chien et al.

(10) Patent No.: US 9,397,129 B2
(45) Date of Patent: Jul. 19, 2016

(54) DIELECTRIC FILM FOR IMAGE SENSOR

(71) Applicant: Taiwan Semiconductor Manufacturing Company Limited, Hsin-Chu (TW)

(72) Inventors: Volume Chien, Sinying (TW); Che-Min Lin, Tainan (TW); Shiu-Ko JangJian, Tainan (TW); Chi-Cherng Jeng, Madou Township (TW); Chih-Mu Huang, Tainan (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/221,602

(22) Filed: Mar. 21, 2014

(65) Prior Publication Data

US 2014/0264696 A1    Sep. 18, 2014

Related U.S. Application Data

(60) Provisional application No. 61/788,472, filed on Mar. 15, 2013.

(51) Int. Cl.
*H01L 31/0232* (2014.01)
*H01L 27/146* (2006.01)

(52) U.S. Cl.
CPC .... *H01L 27/14623* (2013.01); *H01L 27/14627* (2013.01); *H01L 27/14629* (2013.01); *H01L 27/14685* (2013.01)

(58) Field of Classification Search
CPC .......... H01L 27/14623; H01L 27/14629; H01L 27/14627; H01L 27/14685
USPC ........... 257/291, 292, 294, 432, 433, 435
See application file for complete search history.

(56) References Cited

U.S. PATENT DOCUMENTS

2009/0286346 A1* 11/2009 Adkisson et al. ............ 438/65
2013/0249040 A1*  9/2013 Liu ................. H01L 27/14623
                                          257/435

* cited by examiner

*Primary Examiner* — Hung Vu
(74) *Attorney, Agent, or Firm* — Cooper Legal Group, LLC

(57) ABSTRACT

Among other things, one or more image sensors and techniques for forming such image sensors are provided. An image sensor comprises a photodiode array configured to detect light. The image sensor comprises a calibration region configured to detect a color level for image reproduction, such as a black calibration region configured to detect a black level for an image detected by the photodiode array. The image sensor comprises a dielectric film that is formed over the photodiode array and the calibration region. The dielectric film is configured to balance stress between the photodiode and the calibration region in order to improve accuracy of the calibration region.

20 Claims, 6 Drawing Sheets

DIELECTRIC FILM FOR IMAGE SENSOR

BACKGROUND

An image sensor is used to convert an optical image focused on the image sensor into an electrical signal. The image sensor comprises an array of light detecting elements, such as photodiodes, where a light detecting element is configured to produce an electrical signal corresponding to an intensity of light impinging on the light detecting element. The electrical signal is used to display a corresponding image on a monitor or provide information about the optical image. In some embodiments, the image sensor is a charge-coupled device (CCD), a Complementary Metal-Oxide-Semiconductor (CMOS) image sensor device, or other type of sensor.

DETAILED DESCRIPTION

Figure 1:
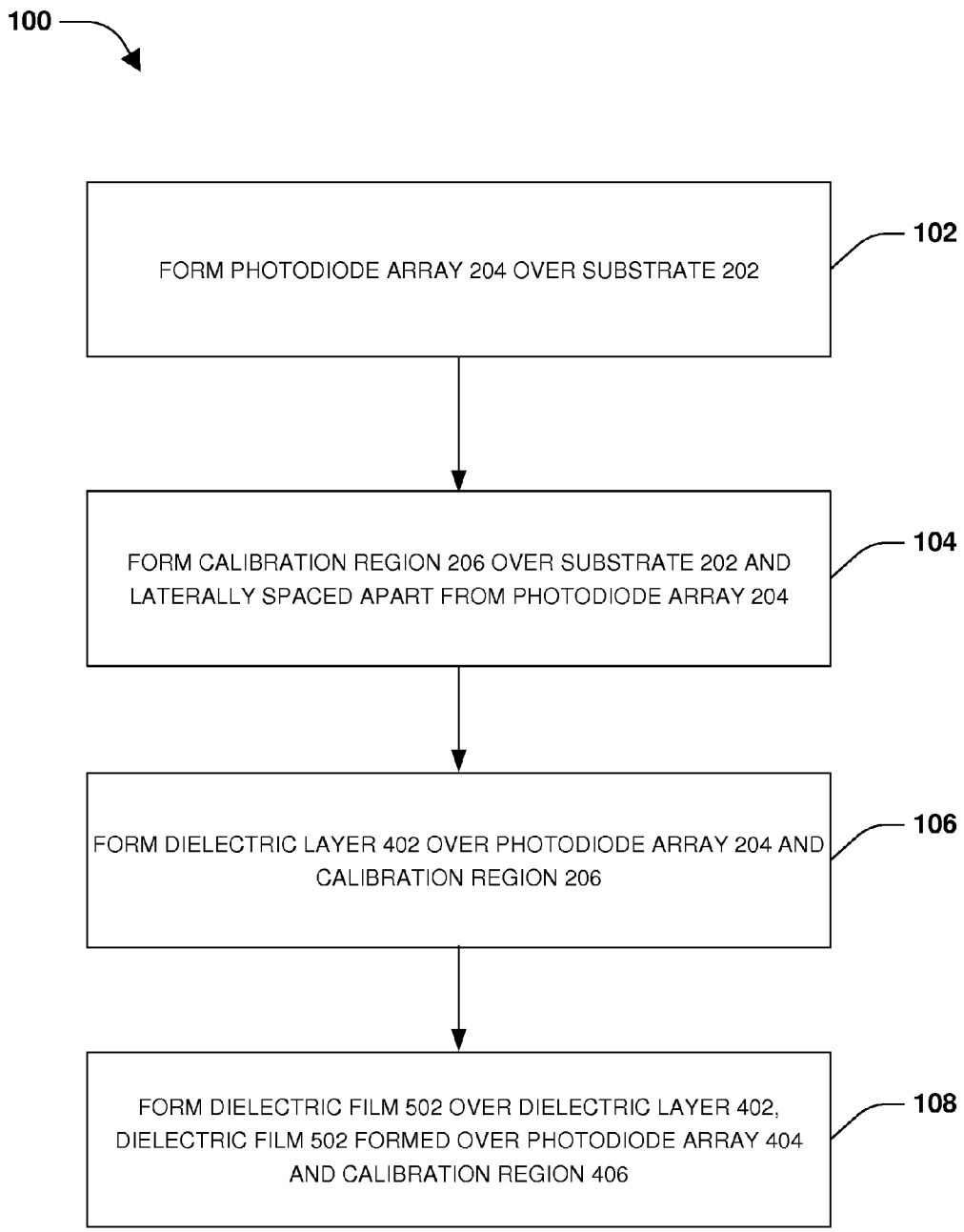
FIG. 1 is a flow diagram illustrating a method of forming an image sensor, according to some embodiments.
Figure 2:
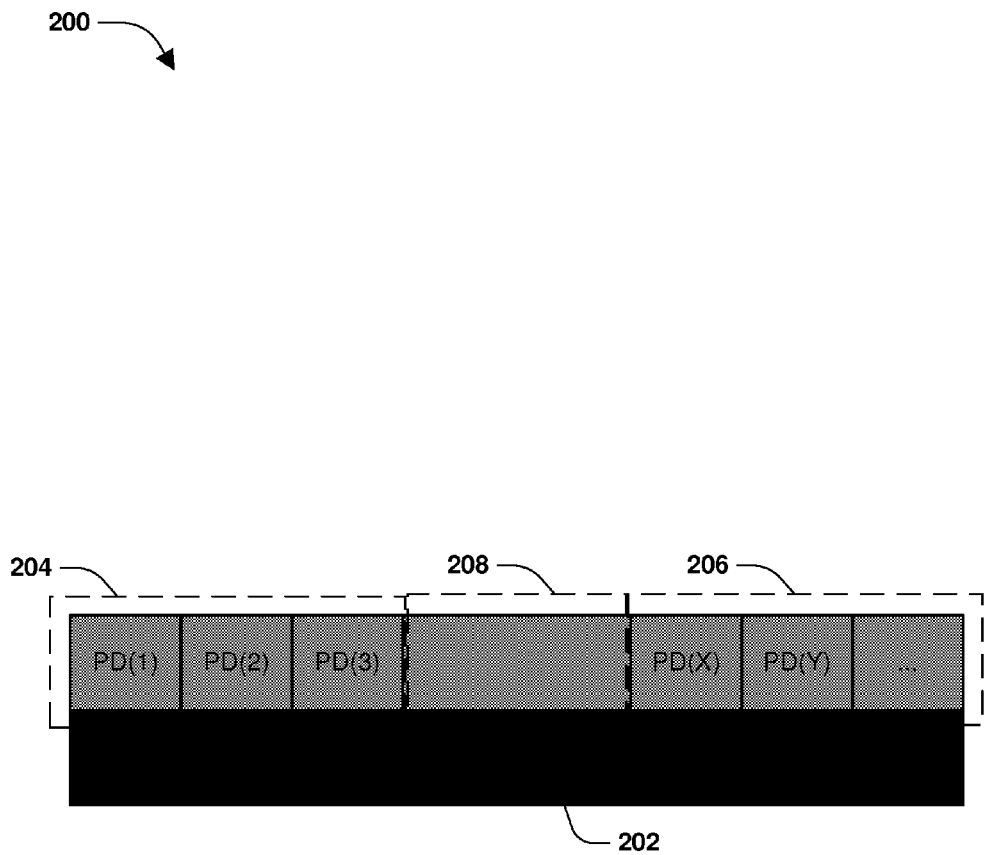
FIG. 2 is an illustration of a photodiode array and a calibration region of an image sensor, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more image sensors and one or more techniques for forming such image sensors are provided herein. An image sensor may comprise a photodiode array configured to detect light. The image sensor may comprise a calibration region, such as a black calibration region, configured to define a color level, such as a black color level, for image reproduction. In some embodiments, if the photodiode array and the calibration region are formed by different fabrication processes (e.g., a metal grid for the photodiode array is formed by a difference process than a metal shield for the calibration region), then stress upon the photodiode array can be different than stress upon the calibration region. The difference in stress can cause a shift in accuracy of the calibration region, which can decrease performance of the calibration region. Accordingly, as provided herein, a dielectric film is formed over the photodiode array and the calibration region in order to balance stress between the photodiode array and the calibration region. Balancing stress can improve accuracy and performance of the calibration region. In some embodiments, the dielectric film is formed continuously over the photodiode array and the calibration region. In some embodiments, a dielectric layer is formed between the dielectric film and the photodiode array, and is formed between the dielectric film and the calibration region. The dielectric film comprises a dielectric material that is different than a dielectric material of the dielectric layer. In some embodiments, dielectric layer comprises silicon oxide and the dielectric film does not comprise silicon oxide. For example, the dielectric film comprises a silicon nitride, a high-k dielectric material, etc.

A method 100 of forming an image sensor, according to some embodiments, is illustrated in FIG. 1, and one or more image sensors formed by such a methodology are illustrates in FIGS. 2-6. At 102, a photodiode array 204 is formed over a substrate 202, as illustrated in example 200 of FIG. 2. The photodiode array 204 comprises one or more photodiodes configured to detect light. At 104, a calibration region 206 is formed over the substrate 202, as illustrated in example 200 of FIG. 2. In some embodiments, the calibration region 206 is formed laterally spaced apart from the photodiode array 204. That is, the calibration region 206 is not formed above or below the photodiode array 204. In some embodiments, a middle region 208 separates the photodiode array 204 and the calibration region 206. The calibration region 206 is configured to define a color level for image reproduction. For example, the calibration region 206 comprises a black level calibration region configured to define a black level for image reproduction of an image detected by the photodiode array 204.

Figure 3:
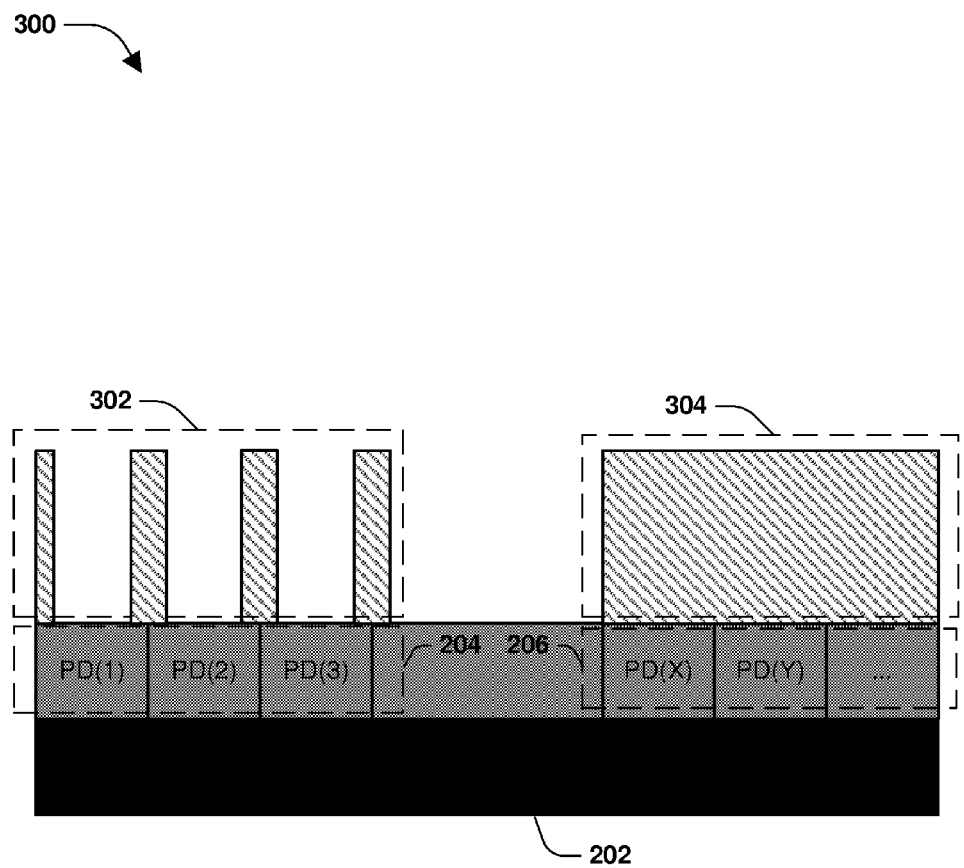
FIG. 3 is an illustration of a metal grid and a metal shield of an image sensor, according to some embodiments.

In some embodiments, a metal grid 302 is formed over the photodiode array 204, as illustrated in example 300 of FIG. 3. The metal grid 302 comprises one or more grid portions configured to guide light towards corresponding photodiodes based upon a reflective property of the metal grid 302. In some embodiments, the metal grid 302 comprises metal, such as tungsten or cooper formed by a patterning process, or another material having a reflective property capable of reflecting light. In some embodiments, a metal shield 304 is formed over the calibration region 206. The metal shield 304 reflects at least some light away from the calibration region 206.

Figure 4:
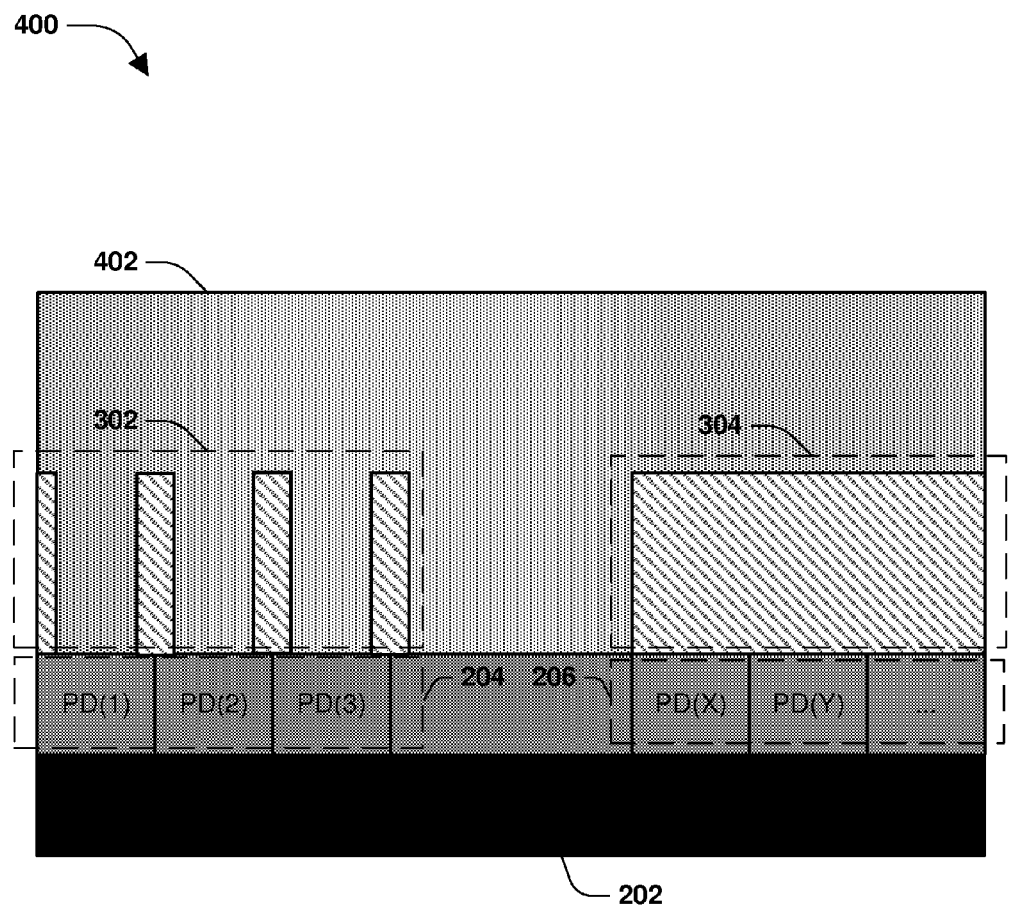
FIG. 4 is an illustration of a dielectric layer, according to some embodiments.
Figure 5:
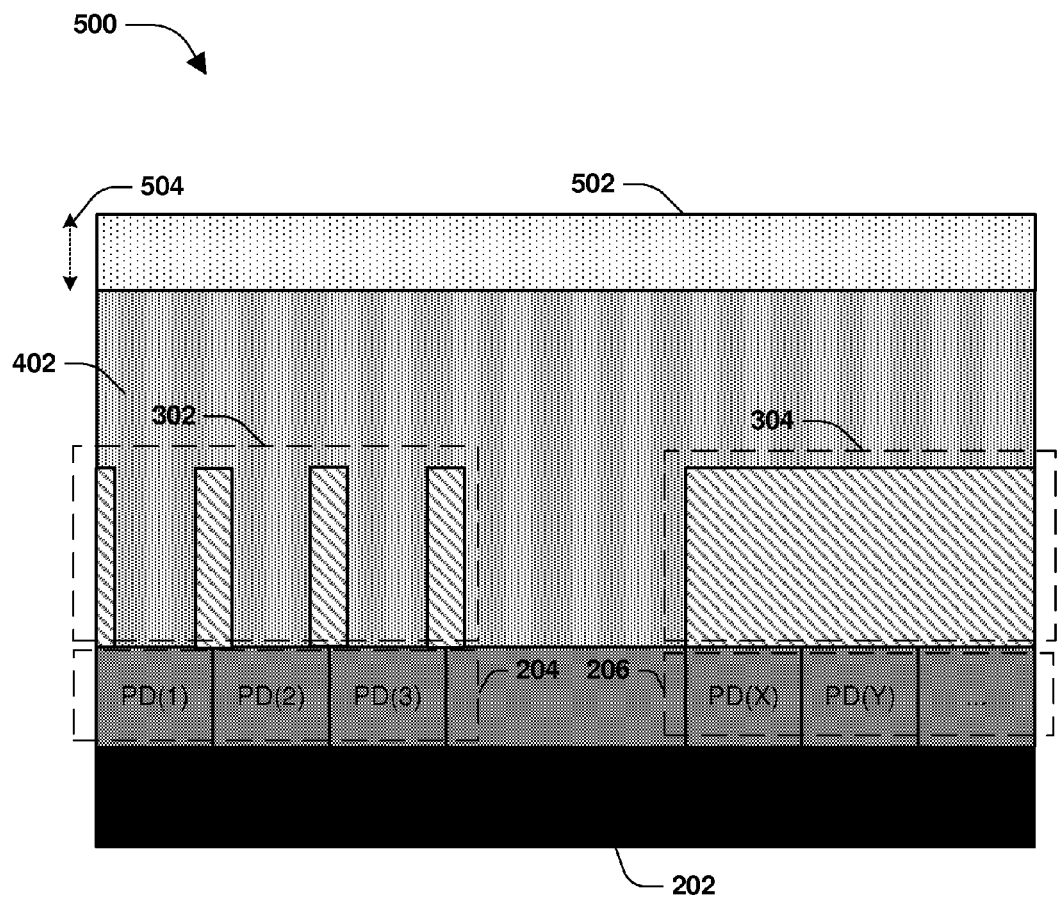
FIG. 5 is an illustration of a dielectric film, according to some embodiments.
Figure 6:
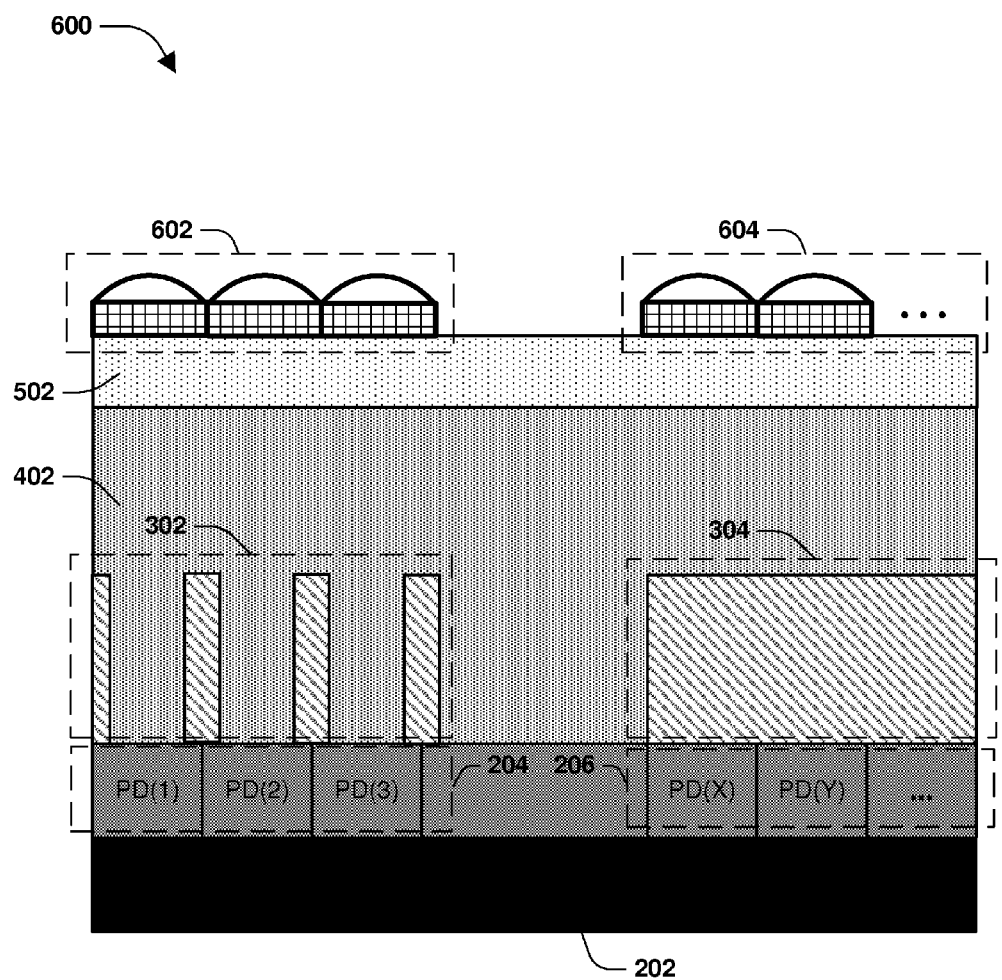
FIG. 6 is an illustration of an image sensor, according to some embodiments.

At 106, a dielectric layer 402 is formed over the photodiode array 204 and the calibration region 206, as illustrated in example 400 of FIG. 4. In some embodiments, the dielectric layer 402 comprises a dielectric material, such as silicon oxide. At 108, a dielectric film 502 is formed over the photodiode array 204, the calibration region 206, and the dielectric layer 402, as illustrated in example 500 of FIG. 5. In some embodiments, the dielectric film 502 is formed over the photodiode array 204, the middle portion 208, the calibration region 206, and the dielectric layer 402 as a continuous film. In an example, the dielectric film 502 comprises a material, such as silicon nitride, silicon oxy-nitride, silicon oxide, nitride, oxide, a high-k material, or other material having a strength that can balance stress between the photodiode array 204 and the calibration region 206. In some embodiments, the dielectric film 502 is formed using at least one of a chemical vapor deposition process, an atomic layer deposition process, a physical vapor deposition process, or other formation process. In some embodiments, the dielectric film 502 is formed to a thickness 504 between about 900 Å to about 4100 Å. A thickness of about 900 Å or more provides the dielectric film 502 with sufficient structural integrity to balance stress between the photodiode array 204 and the calibration region 206. A thickness of about 4100 Å or less mitigates damage to the photodiode array 204 and the calibration region 206, which would otherwise be caused by weight of the dielectric film 502.

Because the dielectric film 502 is form over both the photodiode array 204 and the calibration region 206, the dielectric film 502 aids in balancing stress between the photodiode array 204 and the calibration region 206. In some embodiments, the stress occurs from volumetric changes of materials, such as the metal grid 302 over the photodiode array 204 and the metal shield 304 over the calibration region 206. Such volumetric changes are caused by heating and cooling during processing of the image sensor. Because the structure of the metal grid 302 and the photodiode array 204 is different than the structure of the metal shield 304 and the calibration region 206, such portions of the image sensor expand differently during heating and shrink differently during cooling, thus resulting in differences in stress. Without the dielectric film 502 over both the photodiode array 204 and the calibration region 206, stress upon the calibration region 206 is different than stress on the photodiode array 204. The difference in stress results in variations between the calibration region 206 and the photodiode array 204, such that signals obtained from the photodiode array 204 and regarded as black level signals differ from black level signals obtained from the calibration region 206. Accordingly, given that the image sensor is calibrated using the calibration region 206, signals obtained from the photodiode array 204 that are regarded as black level signals are not in fact black in some situations. Rather, signals obtained from the photodiode array 204 that are regarded as black are actually grey level signals, or other non-black signals, given that the photodiode array 204 has different physical properties from the calibration region 206 due to the stress variations between the calibration region 206 and the photodiode array 204. Using the dielectric film 502 to reduce differences in stress between the calibration region 206 and the photodiode array 204 thus improves accuracy of the image sensor by allowing black level signals obtained from the photodiode array 204 to correspond more closely to black level signals obtained from the calibration region 206, where the calibration region 206 is used to calibrate image sensor.

In some embodiments, one or more lens structures, such as lens structures 602, are formed over the photodiode array 204. In some embodiments, the lens structures 602 are formed over the dielectric layer 402 and the dielectric film 502. A lens structure is configured to focus light towards a corresponding photodiode for detection. In some embodiments, one or more lens structures, such as lens structures 604, are formed over the calibration region 206. In some embodiments, the lens structures 604 are formed over the dielectric layer 402 and the dielectric film 502. In some embodiments, the lens structures 602 and the lens structures 604 are formed over color filter material that allows certain wavelengths of light to pass, while blocking other wavelengths of light.

According to an aspect of the instant disclosure, an image sensor is disclosed. The image sensor comprises a photodiode array comprising one or more photodiodes configured to detect light. The image sensor comprises a calibration region configured to define a color level for image reproduction. The calibration region is formed laterally spaced apart from the photodiode array. The image sensor comprises a dielectric film that is formed over the photodiode array and the calibration region. The dielectric film is configured to balance stress between the photodiode and the calibration region in order to improve accuracy of the calibration region.

According to an aspect of the instant disclosure, a method for forming an image sensor is provided. The method comprises forming a photodiode array over a substrate. A calibration region is formed over the substrate and laterally spaced apart from the photodiode array. A dielectric layer is formed over the photodiode array and the calibration region. A dielectric film is formed over the dielectric layer, such that the dielectric film is formed over the photodiode array and the calibration region. The dielectric film is configured to balance stress between the photodiode and the calibration region in order to improve accuracy of the calibration region.

According to an aspect of the instant disclosure, an image sensor is disclosed. The image sensor comprises a photodiode array comprising one or more photodiodes configured to detect light. The image sensor comprises a calibration region configured to define a color level for image reproduction. The calibration region is formed laterally spaced apart from the photodiode array. The image sensor comprises a dielectric layer formed over the photodiode array and the calibration region. The image sensor comprises a dielectric film formed over the dielectric layer, the photodiode array, and the calibration region. The dielectric film comprises a first dielectric material that is different than a second dielectric material of the dielectric layer.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. An image sensor, comprising:
   a photodiode array comprising one or more photodiodes configured to detect light;
   a calibration region configured to define a color level for image reproduction, the calibration region formed laterally spaced apart from the photodiode array;
   a dielectric layer formed over and in direct contact with the photodiode array; and
   a dielectric film formed over the photodiode array and the calibration region and in contact with the dielectric layer, the dielectric film having a substantially planar bottom surface extending over the photodiode array and the calibration region.

2. The image sensor of claim 1, the calibration region comprising a black level calibration region configured to define a black level for the image reproduction.

3. The image sensor of claim 1, comprising:
   a metal grid formed between the photodiode array and the dielectric layer, the metal grid configured to guide light towards the photodiode array.

4. The image sensor of claim 3, the dielectric layer in contact with the metal grid.

5. The image sensor of claim 1, comprising:
   a metal shield formed over the calibration region.

6. The image sensor of claim 5, the dielectric layer formed between the metal shield and the dielectric film.

7. The image sensor of claim 5, the dielectric layer in contact with the metal shield.

8. The image sensor of claim 1, comprising:
   one or more lens structures formed over the dielectric film and the photodiode array.

9. The image sensor of claim 1, comprising:
   one or more calibration lens structures formed over the dielectric film and the calibration region.

10. The image sensor of claim 1, the dielectric film comprising at least one of silicon nitride or a high-k dielectric material.

11. The image sensor of claim 1, the dielectric layer comprising silicon oxide, and the dielectric film not comprising silicon oxide.

12. An image sensor, comprising:
    a photodiode array comprising one or more photodiodes configured to detect light;
    a calibration region configured to define a color level for image reproduction, the calibration region formed laterally spaced apart from the photodiode array;
    a dielectric layer formed over the photodiode array and the calibration region, the dielectric layer in direct contact with the photodiode array and having a substantially planar top surface extending over the photodiode array and the calibration region; and
    a dielectric film formed over dielectric layer, the photodiode array, and the calibration region, the dielectric film comprising a first dielectric material that is different than a second dielectric material of the dielectric layer.

13. The image sensor of claim 12, the dielectric film formed as a continuous film over the photodiode array and the calibration region.

14. The image sensor of claim 12, the dielectric film formed as a continuous film over the photodiode array, the calibration region, and a middle region between the photodiode array and the calibration region.

15. The image sensor of claim 12, the calibration region comprising a black level calibration region configured to define a black level for the image reproduction.

16. The image sensor of claim 12, comprising:
    a metal shield formed over the calibration region.

17. An image sensor, comprising:
    a photodiode array comprising a first set of one or more photodiodes configured to detect light;
    a calibration region comprising a second set of one or more photodiodes, the calibration region configured to define a color level for image reproduction;
    a metal grid formed over the photodiode array;
    a dielectric layer formed over the photodiode array and the calibration region, wherein the dielectric layer is in direct contact with the photodiode array and a thickness of the dielectric layer is greater than a height of the metal grid; and
    dielectric film formed over dielectric layer, the dielectric film configured to balance stress between the photodiode array and the calibration region.

18. The image sensor of claim 17, the metal grid comprising a first grid portion spaced apart from a second grid portion, wherein dielectric material of the dielectric layer is formed between the first grid portion and the second grid portion.

19. The image sensor of claim 17, the dielectric film comprising a first dielectric material that is different than a second dielectric material of the dielectric layer.

20. The image sensor of claim 17, comprising:
    a metal shield formed over the calibration region, the dielectric layer formed over the metal grid and the metal shield.

* * * * *